US012622308B2

(12) United States Patent
Jin

(10) Patent No.: US 12,622,308 B2
(45) Date of Patent: May 5, 2026

(54) INTERCONNECT STRUCTURE FOR ADVANCED PACKAGING AND METHOD FOR THE SAME

(71) Applicant: OIP Technology Pte Ltd., Singapore (SG)

(72) Inventor: Yonggang Jin, Singapore (SG)

(73) Assignee: OIP TECHNOLOGY PTE LTD., Singapore (SG)

( * ) Notice: Subject to any disclaimer, the term of this patent is extended or adjusted under 35 U.S.C. 154(b) by 462 days.

(21) Appl. No.: 18/300,045

(22) Filed: Apr. 13, 2023

(65) Prior Publication Data

US 2024/0304573 A1     Sep. 12, 2024

(30) Foreign Application Priority Data

Mar. 7, 2023    (CN) .......................... 202310233450.4

(51) Int. Cl.
  H01L 23/00        (2006.01)
(52) U.S. Cl.
  CPC .............. H01L 24/05 (2013.01); H01L 24/11 (2013.01); H01L 24/13 (2013.01); *H01L 2224/0401* (2013.01); *H01L 2224/05155* (2013.01); *H01L 2224/05572* (2013.01); *H01L 2224/11464* (2013.01); *H01L 2224/13144* (2013.01)
(58) Field of Classification Search
  CPC ...................................................... H01L 24/05
  See application file for complete search history.

(56) References Cited

U.S. PATENT DOCUMENTS

| | | | | | |
|---|---|---|---|---|---|
| 5,851,911 | A | * | 12/1998 | Farnworth | .............. H01L 24/02 |
| | | | | | 257/E23.021 |
| 6,277,669 | B1 | * | 8/2001 | Kung | ...................... H01L 24/13 |
| | | | | | 257/E23.021 |
| 6,590,295 | B1 | * | 7/2003 | Liao | ........................ H01L 24/11 |
| | | | | | 257/781 |
| 12,159,847 | B2 | * | 12/2024 | Chen | ....................... H01L 24/19 |
| 2003/0134496 | A1 | * | 7/2003 | Lee | .......................... H01L 24/11 |
| | | | | | 257/E23.021 |
| 2003/0211720 | A1 | * | 11/2003 | Huang | .................... H01L 24/05 |
| | | | | | 257/E23.021 |
| 2004/0004284 | A1 | * | 1/2004 | Lee | ................... H01L 21/76804 |
| | | | | | 438/618 |

(Continued)

*Primary Examiner* — William A Harriston
(74) *Attorney, Agent, or Firm* — MUNCY, GEISSLER, OLDS & LOWE, P.C.

(57) ABSTRACT

An interconnect structure for advanced packaging and method for the interconnect structure are disclosed. The method includes: providing a semiconductor substrate to be packaged having surface on which there is a first pad having conduction-promoting surface; depositing a first passivation layer on surface of the semiconductor substrate, the first pad is exposed from first passivation layer, forming a wiring layer on surface of the first passivation layer by screen printing, and forming a metal layer on surface of the wiring layer by electroless plating, wherein the wiring layer covers the first pad; forming a second passivation layer, which covers the first passivation layer and the interconnect, wherein there is a through hole in the second passivation layer, in which the metal layer is exposed; and forming a second pad by electroless plating, which fills the through hole and covers the second passivation layer around an opening of the through hole.

11 Claims, 3 Drawing Sheets

(56)                    References Cited

U.S. PATENT DOCUMENTS

2007/0182004 A1 *    8/2007    Rinne    ..................... H01L 24/12
                                                                      257/734
2013/0147031 A1 *    6/2013    Chen    ....................... H01L 24/11
                                                                      257/737
2014/0183725 A1 *    7/2014    Lin    ........................ H01L 24/05
                                                                      257/737
2022/0352103 A1 *    11/2022    Chen    ....................... H01L 24/19

* cited by examiner

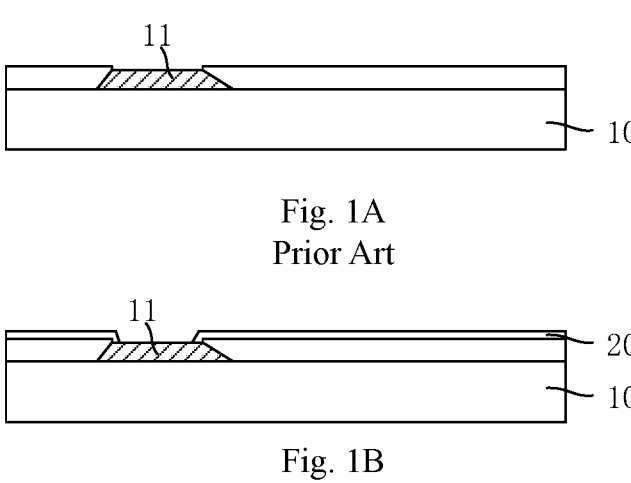
Fig. 1A
Prior Art
Fig. 1B
Prior Art
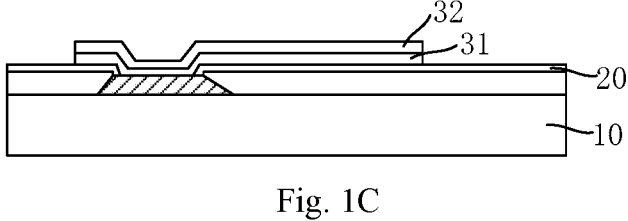
Fig. 1C
Prior Art
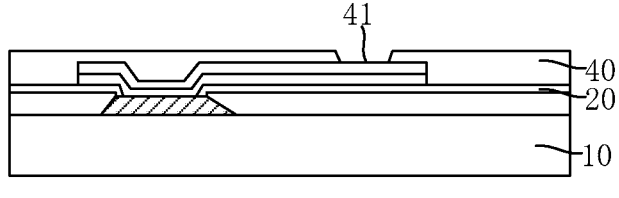
Fig. 1D
Prior Art
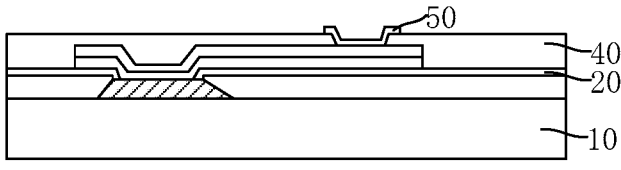
Fig. 1E
Prior Art

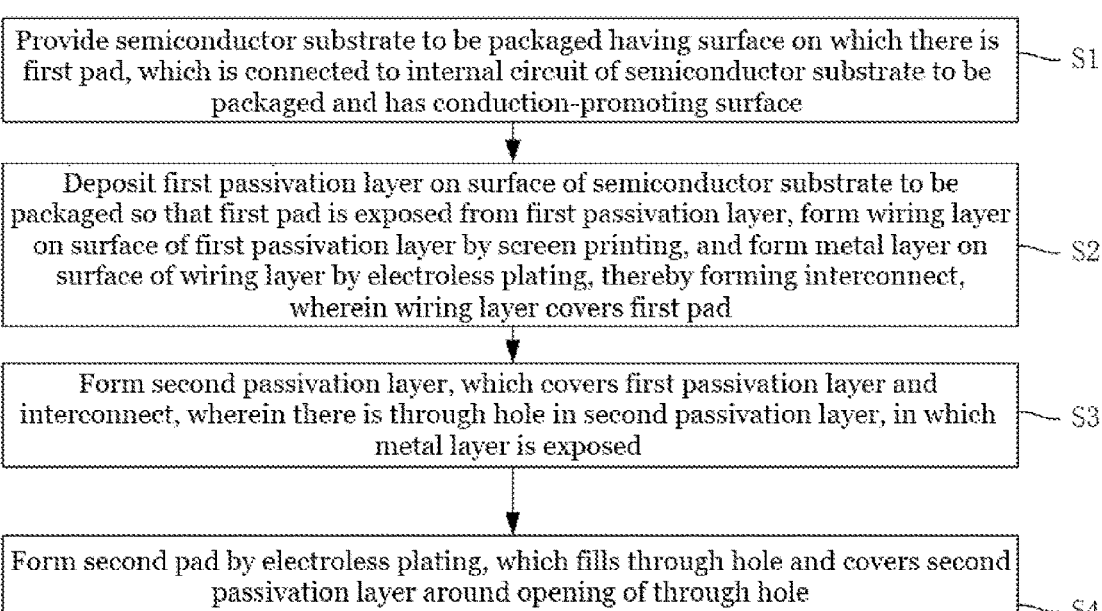

| |
|---|
| Provide semiconductor substrate to be packaged having surface on which there is first pad, which is connected to internal circuit of semiconductor substrate to be packaged and has conduction-promoting surface |

~ S1

| |
|---|
| Deposit first passivation layer on surface of semiconductor substrate to be packaged so that first pad is exposed from first passivation layer, form wiring layer on surface of first passivation layer by screen printing, and form metal layer on surface of wiring layer by electroless plating, thereby forming interconnect, wherein wiring layer covers first pad |

~ S2

| |
|---|
| Form second passivation layer, which covers first passivation layer and interconnect, wherein there is through hole in second passivation layer, in which metal layer is exposed |

~ S3

| |
|---|
| Form second pad by electroless plating, which fills through hole and covers second passivation layer around opening of through hole |

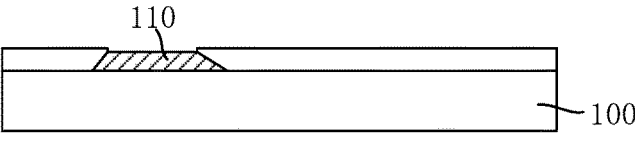

Fig. 3A

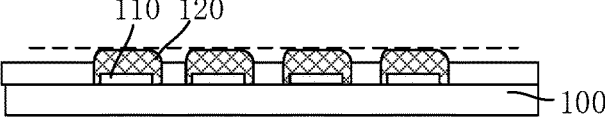

Fig. 3B

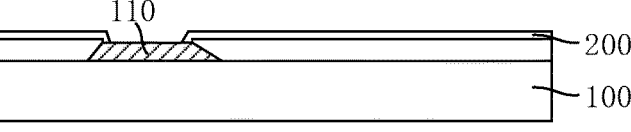

Fig. 3C

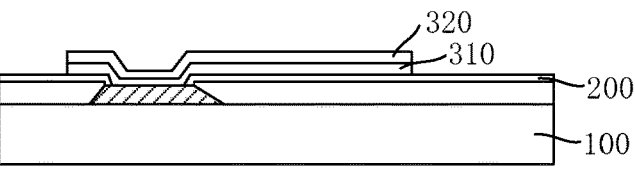

Fig. 3D

INTERCONNECT STRUCTURE FOR ADVANCED PACKAGING AND METHOD FOR THE SAME

CROSS-REFERENCES TO RELATED APPLICATIONS

This application claims the priority of Chinese patent application number 202310233450.4, filed on Mar. 7, 2023, the entire contents of which are incorporated herein by reference.

TECHNICAL FIELD

The present invention relates to the field of semiconductor technology and, in particular, to an interconnect structure for advanced packaging and a method for the interconnect structure.

BACKGROUND

The ever-increasing circuit density and continuous miniaturization of next-generation semiconductor devices have brought about the need for advanced packaging of such semiconductor devices. The so-called advanced packaging is wafer-level packaging and currently often involves physical vapor deposition (PVD), photolithography and etching processes for the fabrication of interconnect structures. These processes are expensive and time-consuming and require hermeticity of the involved equipment.

SUMMARY OF THE INVENTION

It is an objective of the present invention to provide an interconnect structure for advanced packaging and a method for the interconnect structure, which can reduce the process cost and time required for the fabrication of interconnect structures.

To this end, the present invention provides a method for an interconnect structure for advanced packaging, including the steps of:

step S1: providing a semiconductor substrate to be packaged having a surface on which there is a first pad connected to an internal circuit of the semiconductor substrate to be packaged, the first pad having a conduction-promoting surface;

step S2: depositing a first passivation layer on the surface of the semiconductor substrate to be packaged, the first pad is exposed from the first passivation layer, forming a wiring layer on a surface of the first passivation layer by screen printing, and forming a metal layer on a surface of the wiring layer by electroless plating, thereby forming an interconnect, wherein the wiring layer covers the first pad;

step S3: forming a second passivation layer, which covers the first passivation layer and the interconnect, wherein there is a through hole in the second passivation layer, in which the metal layer is exposed; and step S4: forming a second pad by electroless plating, which fills the through hole and covers the second passivation layer around an opening of the through hole.

Optionally, step S1 may include:

providing the semiconductor substrate to be packaged having the surface on which there is the first pad connected to the internal circuit of the semiconductor substrate to be packaged, wherein the first pad is an aluminum pad; and forming a gold bump on a surface of the first pad by punching a gold wire thereon using a bonding machine, thereby turning the surface of the first pad into the conduction-promoting surface.

Additionally, the gold bump may have a thickness of 2 μm to 7 μm.

Optionally, step S1 may include:

providing the semiconductor substrate to be packaged having the surface on which there is the first pad connected to the internal circuit of the semiconductor substrate to be packaged, wherein the first pad is an aluminum pad; and forming a nickel-gold layer on a surface of the first pad by electroless plating, thereby turning the surface of the first pad into the conduction-promoting surface.

Additionally, the nickel-gold layer may have a thickness of 1 μm to 5 μm.

Optionally, step S2 may include:

depositing the first passivation layer on the surface of the semiconductor substrate to be packaged, the first pad is exposed from the first passivation layer;

forming the wiring layer by screen printing and curing a metal paste on the first passivation layer; and forming the metal layer on the wiring layer by electroless plating, thereby resulting in the formation of the interconnect.

Additionally, the metal paste may include silver paste, tungsten paste and gold paste.

Additionally, the formation of the metal layer may include:

forming the metal layer by electroless plating of copper, nickel-gold or nickel-palladium-gold on the wiring layer, thereby resulting in the formation of the interconnect.

Optionally, step S4 may include:

forming the second pad by electroless plating of nickel-gold in the through hole, which fills the through hole and covers the second passivation layer around the opening of the through hole.

Optionally, the method may further include, subsequent to step S4, forming a solder ball on the second pad by BGA packaging.

In another aspect, the present invention provides an interconnect structure for advanced packaging, fabricated using the method as defined above. The interconnect structure includes:

a semiconductor substrate to be packaged having a surface on which there is a first pad connected to an internal circuit of the semiconductor substrate to be packaged, the first pad having a conduction-promoting surface;

a first passivation layer covering the surface of the semiconductor substrate to be packaged, the first pad is exposed from the first passivation layer;

an interconnect including wiring layer and a metal layer, the wiring layer residing on part of a surface of the first passivation layer and covering the first pad, the metal layer residing on the wiring layer;

a second passivation layer covering the first passivation layer and the interconnect, wherein there is a through hole in the second passivation layer, in which the metal layer is exposed; and a second pad filling the through hole and covering the second passivation layer around an opening of the through hole.

Optionally, the first pad may be an aluminum pad and formed on a surface thereof with a gold bump or a nickel-gold layer.

Additionally, the gold bump may have a thickness of 2 μm to 7 μm and the nickel-gold layer may have a thickness of 1 μm to 5 μm.

Compared with the prior art, the present invention has the following benefits:

the present invention provides an interconnect structure for advanced packaging and method for the interconnect structure. The method includes the steps of: step S1: providing a semiconductor substrate to be packaged having a surface on which there is a first pad connected to an internal circuit of the semiconductor substrate to be packaged, the first pad having a conduction-promoting surface; step S2: depositing a first passivation layer on the surface of the semiconductor substrate to be packaged, the first pad is exposed from the first passivation layer, forming a wiring layer on a surface of the first passivation layer by screen printing, and forming a metal layer on a surface of the wiring layer by electroless plating, thereby forming an interconnect, wherein the wiring layer covers the first pad; step S3: forming a second passivation layer, which covers the first passivation layer and the interconnect, wherein there is a through hole in the second passivation layer, in which the metal layer is exposed; and step S4: forming a second pad by electroless plating, which fills the through hole and covers the second passivation layer around an opening of the through hole. According to the present invention, the formation of the interconnect can be achieved without involving any deposition, photolithography, etching or other complicated process, resulting in significant process time and equipment cost savings, as well as increased production efficiency and productivity.

BRIEF DESCRIPTION OF THE DRAWINGS

FIGS. 1A to 1E are schematic diagrams showing intermediate structures formed during a conventional process for forming an interconnect structure.

FIG. 2 is a flowchart of a method for an interconnect structure for advanced packaging according an embodiment of the present invention.

FIGS. 3A to 3G are schematic diagrams showing intermediate structures formed in various steps in a method for an interconnect structure for advanced packaging according an embodiment of the present invention.

Figure 3E:
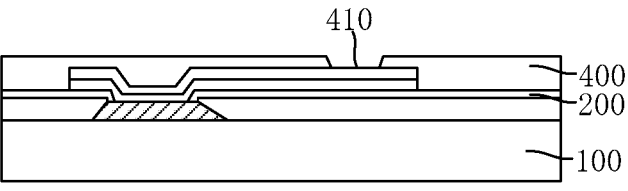

A description of reference numerals in these figures is set forth below.

In FIGS. 1A to 1E,

10—semiconductor substrate to be packaged; 11—aluminum pad; 20—first passivation layer; 31—wiring layer; 32—metal layer; 40—second passivation layer; 41—through hole; 50—pad.

In FIGS. 3A to 3G,

100—semiconductor substrate to be packaged; 110—first pad; 120—gold bump; 200—first passivation layer; 310—wiring layer; 320—metal layer; 400—second passivation layer; 410—through hole; 500—second pad; 600—solder ball.

DETAILED DESCRIPTION

An existing advanced packaging method includes the steps as follows.

As shown in FIG. 1A, at first, a semiconductor substrate to be packaged 10 formed on a surface thereof with an aluminum pad 11 connected to an internal circuit of the semiconductor substrate to be packaged 10 is provided.

As shown in FIG. 1B, a first passivation layer 20 is then deposited on the surface of the semiconductor substrate to be packaged 10. The aluminum pad 11 is exposed from the first passivation layer 20.

As shown in FIG. 1C, next, a seed layer 31 is deposited on a surface of the first passivation layer 20 by physical vapor deposition (PVD). The seed layer 31 covers the aluminum pad 11. The seed layer 31 serves to facilitate the subsequent deposition of a metal layer 32 and to connect the aluminum pad 11 to the metal layer 32.

Subsequently, in order to form a via hole and an interconnect structure, photoresist is coated on the seed layer 31, and a pattern for the metal layer is defined therein by photolithography and etching processes. The metal layer 32 is then formed on the seed layer 31 by electroplating. As a result, the interconnect structure is formed. The metal layer 32 can thicken the resulting interconnect structure. After that, the seed layer 31 exposed from the metal layer 32 is etched away.

As shown in FIG. 1D, afterward, a second passivation layer 40 is formed on the interconnect structure so as to further cover the first passivation layer 20, and a through hole 41 is then formed in the second passivation layer 40. The metal layer 32 is exposed at the bottom of the through hole 41.

As shown in FIG. 1E, after that, an under bump metallization (UBM) structure is formed in the through hole 41 by deposition and etching processes.

In these steps, since the aluminum pad 11 is susceptible to surface oxidation, before the PVD process, it is typically necessary to physically bombard the surface of the semiconductor substrate to be packaged with an inert gas (such as argon) in a vacuum environment to remove or reduce a thickness of the oxide on the surface of the aluminum pad to enable electrical conduction between the aluminum pad and the interconnect structure. Moreover, the formation and interconnection (e.g., with the aluminum pad and the UBM structure) of the interconnect structure involve deposition, photolithography, etching and other processes that involve multiple operations on multiple pieces of equipment. This makes the formation of the interconnect structure a less productive, costly and labor- and equipment-intensive process.

In order to overcome the above problems, it is principal object of the present invention to provide a method of an interconnect structure for advanced packaging, which includes the steps of:

step S1: providing a semiconductor substrate to be packaged having a surface on which there is a first pad connected to an internal circuit of the semiconductor substrate to be packaged, the first pad having a conduction-promoting surface;

step S2: depositing a first passivation layer on the surface of the semiconductor substrate to be packaged, the first pad is exposed from the first passivation layer, forming a wiring layer on a surface of the first passivation layer by screen printing, and forming a metal layer on a surface of the wiring layer by electroless plating, thereby forming an interconnect, wherein the wiring layer covers the first pad;

step S3: forming a second passivation layer, which covers the first passivation layer and the interconnect, wherein there is a through hole in the second passivation layer, in which the metal layer is exposed; and step S4: forming a second pad by electroless plating, which fills the through hole and covers the second passivation layer around an opening of the through hole.

As can be seen, the method of the present invention can be used to form an interconnect structure without involving deposition, photolithography, etching and other complicated processes, resulting in significant process time and equipment cost savings, as well as increased production efficiency and productivity.

The present invention also provides an interconnect structure for advanced packaging, which can be made using the above method. The interconnect structure includes:

a semiconductor substrate to be packaged having a surface on which there is a first pad connected to an internal circuit of the semiconductor substrate to be packaged, the first pad having a conduction-promoting surface;

a first passivation layer covering the surface of the semiconductor substrate to be packaged, the first pad is exposed from the first passivation layer;

an interconnect including a wiring layer and a metal layer, the wiring layer residing on part of a surface of the first passivation layer and covering the first pad, the metal layer residing on the wiring layer;

a second passivation layer covering the first passivation layer and the interconnect, the second passivation layer having a through hole, in which the metal layer is exposed; and a second pad, which fills the through hole and covers the second passivation layer around an opening of the through hole.

The interconnect structure for advanced packaging and the method thereof proposed in the present invention will be described in greater detail below. The present invention will be described in greater detail below with reference to the accompanying drawings, which present preferred embodiments of the invention. It would be appreciated that those skilled in the art can make changes to the invention disclosed herein while still obtaining the beneficial results thereof. Therefore, the following description shall be construed as being intended to be widely known by those skilled in the art rather than as limiting the invention.

For the sake of clarity, not all features of actual implementations are described. In the following, description and details of well-known functions and structures are omitted to avoid unnecessarily obscuring the invention. It should be appreciated that in the development of any such actual implementation, numerous implementation-specific decisions must be made to achieve specific goals of the developers, such as compliance with system-related and business-related constrains, which may vary from one implementation to another. Moreover, it should be appreciated that such a development effort might be complex and time consuming, but would nevertheless be a routine undertaking for those of ordinary skill in the art.

Objectives and features of the present invention will become more apparent upon reading the following more detailed description thereof made with reference to the accompanying drawings and to particular embodiments. Note that the figures are provided in a very simplified form not necessarily drawn to exact scale and for the only purpose of facilitating easy and clear description of the disclosed embodiments.

FIG. 2 is a flowchart of a method for an interconnect structure for advanced packaging according to an embodiment of the present invention. The method of this embodiment is suitable for interconnect structures in wafer-level packaging, fan-out packaging and embedded substrate applications. The method includes the steps of:

step S1: providing a semiconductor substrate to be packaged having a surface on which there is a first pad connected to an internal circuit of the semiconductor substrate to be packaged, the first pad having a conduction-promoting surface;

step S2: depositing a first passivation layer on the surface of the semiconductor substrate to be packaged, the first pad is exposed from the first passivation layer, forming a wiring layer on a surface of the first passivation layer by screen printing, and forming a metal layer on a surface of the wiring layer by electroless plating, thereby forming an interconnect, wherein the wiring layer covers the first pad;

step S3: forming a second passivation layer, which covers the first passivation layer and the interconnect, wherein there is a through hole in the second passivation layer, in which the metal layer is exposed; and step S4: forming a second pad by electroless plating, which fills the through hole and covers the second passivation layer around an opening of the through hole.

The method of the present embodiment will be described in detail below with reference to FIGS. 3A to 3G.

First of all, in step S1, a semiconductor substrate to be packaged 100 having a surface on which there is a first pad 110 connected to an internal circuit of the semiconductor substrate to be packaged is provided. The first pad has a conduction-promoting surface.

A more detailed description of this step is set forth below.

As shown in FIG. 3A, first of all, the semiconductor substrate to be packaged 100 is provided. The first pad 110 connected to the internal circuit of the semiconductor substrate to be packaged 100 is provided on a surface of the semiconductor substrate to be packaged 100. The semiconductor substrate to be packaged 100 may be a wafer-level semiconductor substrate. The semiconductor substrate to be packaged 100 may be a silicon wafer, for example. In this case, the first pad 110 may be an aluminum pad. Such an aluminum pad is susceptible to surface oxidation, the resulting surface oxide is detrimental to electrical conduction between the subsequently formed interconnect and the first pad 110. Alternatively, the semiconductor substrate to be packaged 100 may be a III-V wafer (e.g., a gallium nitride wafer). In this case, the first pad may be a gold pad or a nickel-gold pad, which is resistant to oxidation and can result in good electrical conduction between the subsequently formed interconnect and the first pad 110.

As shown in FIG. 3B, in case of the first pad 110 being implemented as an aluminum pad, a gold bump 120 may be formed on a surface of the first pad 110 by punching a gold wire thereon using a bonding machine, thereby turning the surface into a conduction-promoting surface. During the punching process for forming the gold bump 120, the gold will rub the surface of the aluminum pad and crush an oxide layer thereon. Therefore, the gold bump 120 can improve electrical conduction between the subsequently formed interconnect and the first pad 110. The gold bump 120 may have a thickness of 2 $\mu$m to 7 $\mu$m, preferably 3 $\mu$m to 5 $\mu$m.

In case of the first pad 110 being implemented as an aluminum pad, it is also possible to turning the surface of the first pad into a conduction-promoting surface through forming a nickel-gold layer thereon using an electroless plating process. As a result of the electroless plating process, there is no or little oxide remaining on the surface of the aluminum pad, and the resulting nickel-gold layer can also improve electrical conduction between the subsequently formed interconnect and the first pad 110. The nickel-gold layer may have a thickness of 1 μm to 5 μm, preferably 3 μm to 5 μm.

Subsequently, in step S2, a first passivation layer 200 is deposited on the surface of the semiconductor substrate to be packaged 100, the first pad 110 is exposed from the first passivation layer 200. Moreover, a wiring layer 310 is formed on a surface of the first passivation layer 200 by screen printing, and a metal layer 320 on a surface of the wiring layer 310 by electroless plating, thereby forming an interconnect. The wiring layer 310 covers the first pad 110.

A more detailed description of this step is set forth below.

As shown in FIG. 3C, at first, the first passivation layer 200 is deposited on the surface of the semiconductor substrate to be packaged 100, the first pad 110 is exposed from the first passivation layer 200.

As shown in FIG. 3D, the wiring layer 310 is formed by screen printing a pattern of the wiring layer 310 on the first passivation layer 200 with a metal paste and then curing the metal paste pattern. The pattern of the wiring layer 310 is a wiring pattern for the interconnect. In this way, the formation of the wiring layer 310 does not involve any special deposition, photolithography, etching or other complicated process for defining the pattern of the wiring layer 310. Examples of the metal paste may include silver paste, tungsten paste and gold paste made of gold powder.

Subsequently, the metal layer 320 is formed by plating a metal (e.g., copper, nickel-gold, nickel-palladium-gold, etc.) on the wiring layer 310 by electroless plating, resulting in the formation of the interconnect structure. The metal layer 320 may be made of a material that can impart lower resistivity to the interconnect.

In this way, the formation of the interconnect can be achieved without involving any deposition, photolithography, etching or other complicated process, resulting in significant process time and equipment cost savings.

After that, in step S3, a second passivation layer is formed, which covers the first passivation layer 200 and the interconnect. There is a through hole 410 in the second passivation layer 400, in which the metal layer 320 is exposed.

A more detailed description of this step is set forth below.

As shown in FIG. 3E, at first, the second passivation layer 400 is deposited on the first passivation layer 200 and the interconnect.

Next, the through hole 410 is formed by etching the second passivation layer 400 until the metal layer 320 is exposed at the bottom of the through hole 410.

Afterward, in step S4, a second pad 500 is formed by electroless plating. The second pad 500 fills the through hole 410 and covers the second passivation layer 400 around an opening of the through hole 410.

A more detailed description of this step is set forth below.

Figure 3F:
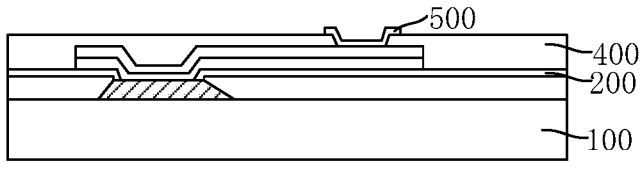

As shown in FIG. 3F, first of all, the second pad 500 may be formed by electroless plating of nickel-gold in the through hole 410. The resulting second pad 500 fills the through hole 410 and covers the second passivation layer 400 around the opening of the through hole 410. In this way, the second pad 500 can have a larger surface area.

Figure 3G:
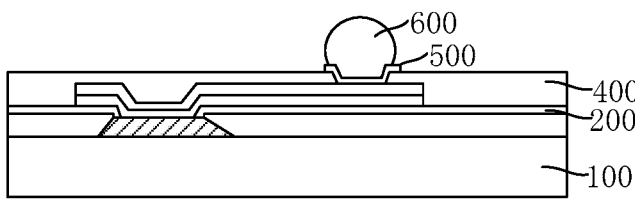

As shown in FIG. 3G, subsequently, a solder ball 600 may be formed on the second pad 500 by BGA packaging. Through the solder ball 600, the packaged semiconductor substrate can be welded to another device (i.e., a PCB). Through the solder ball 600, the resulting package can also be welded to another device (i.e., a PCB).

Referring to FIG. 3G, the present invention also provides an interconnect structure for advanced packaging, which includes a semiconductor substrate to be packaged 100 having a surface on which there is a first pad 110 connected to an internal circuit of the semiconductor substrate to be packaged 100. The semiconductor substrate to be packaged 100 is formed on the surface thereof with a first passivation layer 200, and the first pad 110 is exposed from the first passivation layer 200.

An interconnect is formed on the first passivation layer 200 so as to cover the first pad 110 and be electrically connected thereto.

The interconnect includes a wiring layer 310 and a metal layer 320. The wiring layer 310 resides on part of a surface of the first passivation layer 200 and covers the first pad 110. The metal layer 320 resides on the wiring layer 310.

A second passivation layer 400 is formed on the first passivation layer 200 and the interconnect. The second passivation layer 400 has a through hole 410, in which the metal layer 320 of the interconnect is exposed. A second pad 500 is formed on the second passivation layer 400. The second pad 500 fills the through hole 410 and covers the second passivation layer 400 around an opening of the through hole 410.

The first pad 110 has a conduction-promoting surface. In case of the first pad 110 being implemented as an aluminum pad, a gold bump or a nickel-gold layer may be formed on a surface of the first pad 110 to establish good electrical conduction between the first pad 110 and the interconnect. The gold bump may have a thickness of 2 μm to 7 μm, and the nickel-gold layer may have a thickness of 1 μm to 5 μm.

In summary, the present invention provides an interconnect structure for advanced packaging and method for the interconnect structure. The method includes the steps of: step S1: providing a semiconductor substrate to be packaged having a surface on which there is a first pad connected to an internal circuit of the semiconductor substrate to be packaged, the first pad having a conduction-promoting surface; step S2: depositing a first passivation layer on the surface of the semiconductor substrate to be packaged, the first pad is exposed from the first passivation layer, forming a wiring layer on a surface of the first passivation layer by screen printing, and forming a metal layer on a surface of the wiring layer by electroless plating, thereby forming an interconnect, wherein the wiring layer covers the first pad; step S3: forming a second passivation layer, which covers the first passivation layer and the interconnect, wherein there is a through hole in the second passivation layer, in which the metal layer is exposed; and step S4: forming a second pad by electroless plating, which fills the through hole and covers the second passivation layer around an opening of the through hole. According to the present invention, the formation of the interconnect can be achieved without involving any deposition, photolithography, etching or other complicated process, resulting in significant process time and equipment cost savings, as well as increased production efficiency and productivity.

It is to be noted that, as used herein, the terms "first" and "second" are only meant to distinguish various components, elements, steps, etc. from each other rather than indicate logical or sequential orderings thereof, unless otherwise indicated or specified.

It is to be understood that while the invention has been described above with reference to preferred embodiments thereof, it is not limited to these embodiments. In light of the above teachings, any person familiar with the art may make many possible modifications and variations to the disclosed embodiments or adapt them into equivalent embodiments, without departing from the scope of the invention. Accordingly, it is intended that any and all simple variations, equivalent changes and modifications made to the foregoing embodiments based on the substantive disclosure of the invention without departing from the scope thereof fall within this scope.

What is claimed is:

1. A method for an interconnect structure for advanced packaging, comprising the steps of:

step S1: providing a semiconductor substrate to be packaged having a surface on which there is a first pad, the first pad connected to an internal circuit of the semiconductor substrate to be packaged, the first pad having a conduction-promoting surface;

step S2: depositing a first passivation layer on the surface of the semiconductor substrate to be packaged, wherein the first pad is exposed from the first passivation layer, forming a wiring layer on a surface of the first passivation layer by screen printing, and forming a metal layer on a surface of the wiring layer by electroless plating, thereby forming an interconnect, wherein the wiring layer covers the first pad;

step S3: forming a second passivation layer, which covers the first passivation layer and the interconnect, wherein the second passivation layer has a through hole formed therein, the metal layer is exposed in the through hole; and step S4: forming a second pad by electroless plating, which fills the through hole and covers the second passivation layer around an opening of the through hole, wherein the step S1 comprises:

providing the semiconductor substrate to be packaged having the surface on which there is the first pad connected to the internal circuit of the semiconductor substrate to be packaged, wherein the first pad is an aluminum pad; and forming a gold bump on a surface of the first pad by punching a gold wire thereon using a bonding machine, thereby turning the surface of the first pad into the conduction-promoting surface.

2. The method of claim 1, wherein the gold bump has a thickness of 2 μm to 7 μm.

3. The method of claim 1, wherein the step S1 comprises:

providing the semiconductor substrate to be packaged having the surface on which there is the first pad connected to the internal circuit of the semiconductor substrate to be packaged, wherein the first pad is an aluminum pad; and forming a nickel-gold layer on a surface of the first pad by electroless plating, thereby turning the surface of the first pad into the conduction-promoting surface.

4. The method of claim 3, wherein the nickel-gold layer has a thickness of 1 μm to 5 μm.

5. The method of claim 1, wherein the step S2 comprises:

depositing the first passivation layer on the surface of the semiconductor substrate to be packaged, wherein the first pad is exposed from the first passivation layer;

forming the wiring layer by screen printing and curing a metal paste on the first passivation layer; and forming the metal layer on the wiring layer by electroless plating, thereby forming the interconnect.

6. The method of claim 5, wherein the metal paste includes silver paste, tungsten paste and gold paste.

7. The method of claim 5, wherein the formation of the metal layer comprises:

forming the metal layer by electroless plating of copper, nickel-gold or nickel-palladium-gold on the wiring layer, thereby forming the interconnect.

8. The method of claim 1, wherein the step S4 comprises:

forming the second pad by electroless plating of nickel-gold in the through hole, which fills the through hole and covers the second passivation layer around the opening of the through hole.

9. The method of claim 1, further comprising, subsequent to the step S4, forming a solder ball on the second pad by BGA packaging.

10. An interconnect structure for advanced packaging, fabricated using the method of claim 1, the interconnect structure comprising:

a semiconductor substrate to be packaged having a surface on which there is a first pad, the first pad connected to an internal circuit of the semiconductor substrate to be packaged, the first pad having a conduction-promoting surface;

a first passivation layer covering the surface of the semiconductor substrate to be packaged, the first pad is exposed from the first passivation layer;

an interconnect comprising a wiring layer and a metal layer, the wiring layer residing on part of a surface of the first passivation layer and covering the first pad, the metal layer residing on the wiring layer;

a second passivation layer covering the first passivation layer and the interconnect, wherein the second passivation layer has a through hole formed therein, the metal layer is exposed in the through hole; and a second pad filling the through hole and covering the second passivation layer around an opening of the through hole, wherein the first pad is an aluminum pad and formed on a surface thereof with a gold bump or a nickel-gold layer, and the gold bump has a thickness of 2 μm to 7 μm.

11. The interconnect structure of claim 10, wherein the nickel-gold layer has a thickness of 1 μm to 5 μm.

* * * * *